(12) United States Patent
Panavalappil Kumarankutty et al.

(10) Patent No.: US 11,598,004 B2
(45) Date of Patent: Mar. 7, 2023

(54) LID ASSEMBLY APPARATUS AND METHODS FOR SUBSTRATE PROCESSING CHAMBERS

(71) Applicant: Applied Materials, Inc., Santa Clara, CA (US)

(72) Inventors: Hanish Kumar Panavalappil Kumarankutty, Bangalore (IN); Prashant A. Desai, Bangalore (IN); Diwakar N. Kedlaya, San Jose, CA (US); Sumit Agarwal, Dublin, CA (US); Vidyadharan Srinivasa Murthy Bangalore, Bengaluru (IN); Truong Nguyen, Milpitas, CA (US); Zubin Huang, Santa Clara, CA (US)

(73) Assignee: APPLIED MATERIALS, iNC., Santa Clara, CA (US)

( * ) Notice: Subject to any disclaimer, the term of this patent is extended or adjusted under 35 U.S.C. 154(b) by 26 days.

(21) Appl. No.: 16/802,284

(22) Filed: Feb. 26, 2020

(65) Prior Publication Data
US 2020/0291522 A1    Sep. 17, 2020

(30) Foreign Application Priority Data

Mar. 11, 2019  (IN) .............................. 201941009365

(51) Int. Cl.
*C23C 16/40* (2006.01)
*C23C 16/455* (2006.01)

(52) U.S. Cl.
CPC .. *C23C 16/45565* (2013.01); *C23C 16/45574* (2013.01)

(58) Field of Classification Search
CPC .................... C23C 16/45565; C23C 16/45574
USPC .......... 118/715; 156/345.33, 345.34, 345.35, 156/345.36
See application file for complete search history.

(56) References Cited

U.S. PATENT DOCUMENTS

| | | | |
|---|---|---|---|
| 6,089,472 A * | 7/2000 | Carter ................... | C23C 16/455 239/422 |
| 6,720,027 B2 * | 4/2004 | Yang ................... | C23C 16/0272 257/E21.171 |
| 6,821,563 B2 * | 11/2004 | Yudovsky ........... | C23C 16/4412 427/248.1 |
| 6,830,624 B2 | 12/2004 | Janakiraman et al. | |

(Continued)

FOREIGN PATENT DOCUMENTS

WO    2008067379 A2    6/2008

OTHER PUBLICATIONS

PCT/US2020/019801, International Search Report/Written Opinion dated Jun. 19, 2020, 10 pages.

*Primary Examiner* — Rudy Zervigon
(74) *Attorney, Agent, or Firm* — Patterson + Sheridan LLP

(57) ABSTRACT

The present disclosure relates to a lid assembly apparatus and related methods for substrate processing chambers. In one implementation, a lid assembly includes a gas manifold. The gas manifold includes a first gas channel configured to receive a process gas, a second gas channel configured to receive a doping gas, and a third gas channel configured to receive a cleaning gas. The lid assembly also includes a showerhead. The showerhead includes one or more first gas openings that are configured to receive the process gas, and one or more second gas openings that are configured to receive the doping gas.

11 Claims, 12 Drawing Sheets

(56) References Cited

U.S. PATENT DOCUMENTS

| | | | | |
|---|---|---|---|---|
| 6,921,437 B1* | 7/2005 | DeDontney | C23C 16/45565 | 118/715 |
| 7,410,676 B2* | 8/2008 | Kim | C23C 16/45514 | 117/92 |
| 7,422,636 B2* | 9/2008 | Ishizaka | C23C 16/4401 | 118/663 |
| 7,666,479 B2* | 2/2010 | Strang | C23C 16/45523 | 427/569 |
| 7,674,352 B2* | 3/2010 | Bour | C23C 16/45572 | 156/345.34 |
| 7,846,291 B2* | 12/2010 | Otsuki | C23C 4/11 | 156/345.1 |
| 7,918,938 B2* | 4/2011 | Provencher | F16K 51/02 | 118/715 |
| 7,976,631 B2* | 7/2011 | Burrows | C23C 16/45578 | 118/715 |
| 8,088,248 B2* | 1/2012 | Larson | H01L 21/31144 | 156/345.33 |
| 8,133,323 B2* | 3/2012 | Kakegawa | C23C 16/34 | 118/724 |
| 8,333,839 B2* | 12/2012 | Oh | C23C 16/45551 | 118/715 |
| 8,506,713 B2* | 8/2013 | Takagi | C23C 16/45574 | 118/715 |
| 8,882,913 B2* | 11/2014 | Byun | C23C 16/45514 | 118/715 |
| 8,882,915 B2* | 11/2014 | Kato | C23C 16/458 | 118/719 |
| 8,960,235 B2* | 2/2015 | Carlson | C23C 16/45574 | 137/884 |
| 9,057,128 B2 | 6/2015 | Olgado | | |
| 9,315,897 B2* | 4/2016 | Byun | C23C 16/45574 | |
| 9,349,619 B2* | 5/2016 | Kawamata | H01L 21/67069 | |
| 9,416,450 B2* | 8/2016 | Nguyen | C23C 16/45565 | |
| 9,425,028 B2* | 8/2016 | Kuwabara | H01J 37/32036 | |
| 9,441,791 B2* | 9/2016 | Mizusawa | C23C 16/52 | |
| 9,574,268 B1* | 2/2017 | Dunn | C23C 16/4544 | |
| 9,587,312 B2* | 3/2017 | Silva | C23C 16/45572 | |
| 9,663,856 B2* | 5/2017 | Kasai | H01J 37/32192 | |
| 9,677,176 B2* | 6/2017 | Chandrasekharan | C23C 16/45572 | |
| 9,735,034 B2 | 8/2017 | Vellore et al. | | |
| 9,951,421 B2* | 4/2018 | Lind | C23C 16/4408 | |
| 10,109,514 B2 | 10/2018 | Vellore et al. | | |
| 10,214,816 B2* | 2/2019 | Haverkamp | C23C 16/345 | |
| 10,276,353 B2* | 4/2019 | Alayavalli | C23C 16/45574 | |
| 10,472,717 B2* | 11/2019 | Sawachi | C23C 16/45561 | |
| 10,480,073 B2* | 11/2019 | Murakawa | C23C 16/4412 | |
| 10,662,527 B2* | 5/2020 | Marquardt | C23C 16/4544 | |
| 10,851,457 B2* | 12/2020 | Shaikh | H01L 21/02216 | |
| 10,896,831 B2* | 1/2021 | Suzuki | C23C 16/455 | |
| 10,900,122 B2* | 1/2021 | Shugrue | C23C 16/4508 | |
| 10,934,621 B2* | 3/2021 | Sung | C23C 16/509 | |
| 10,954,597 B2* | 3/2021 | de Ridder | C23C 16/45548 | |
| 2001/0003271 A1* | 6/2001 | Otsuki | C23C 16/45574 | 118/723 I |
| 2002/0173078 A1* | 11/2002 | Kawano | C23C 16/0281 | 438/115 |
| 2003/0124842 A1 | 7/2003 | Hytros et al. | | |
| 2003/0190497 A1* | 10/2003 | Yang | C23C 16/45565 | 428/698 |
| 2003/0190804 A1* | 10/2003 | Glenn | C23C 16/45508 | 438/689 |
| 2004/0025787 A1* | 2/2004 | Selbrede | C23C 16/45553 | 118/715 |
| 2004/0035358 A1* | 2/2004 | Basceri | C23C 16/45565 | 118/715 |
| 2004/0099213 A1* | 5/2004 | Adomaitis | C23C 16/52 | 118/715 |
| 2004/0105935 A1* | 6/2004 | Park | C23C 16/45529 | 427/255.28 |
| 2004/0118519 A1 | 6/2004 | Sen et al. | | |
| 2004/0123803 A1* | 7/2004 | Strang | C23C 16/45565 | 118/723 E |
| 2004/0216665 A1* | 11/2004 | Soininen | C23C 16/4412 | 118/715 |
| 2004/0247787 A1* | 12/2004 | Mackie | C23C 16/40 | 427/248.1 |
| 2005/0016457 A1* | 1/2005 | Kawasaki | C23C 16/45563 | 118/723 E |
| 2005/0092248 A1* | 5/2005 | Lee | C30B 25/14 | 118/715 |
| 2006/0021574 A1* | 2/2006 | Armour | C23C 16/45574 | 427/248.1 |
| 2009/0081826 A1* | 3/2009 | Cowdery-Corvan | C23C 16/45574 | 438/104 |
| 2009/0095221 A1* | 4/2009 | Tam | C23C 16/34 | 118/715 |
| 2009/0117746 A1* | 5/2009 | Masuda | H01L 21/67069 | 438/710 |
| 2009/0169744 A1* | 7/2009 | Byun | C23C 16/45514 | 427/255.28 |
| 2009/0178615 A1* | 7/2009 | Kim | C23C 16/45565 | 118/715 |
| 2010/0003405 A1* | 1/2010 | Kappeler | C30B 25/14 | 427/255.28 |
| 2010/0300359 A1* | 12/2010 | Armour | C23C 16/45572 | 118/724 |
| 2011/0097487 A1* | 4/2011 | Kerr | C23C 16/45551 | 427/248.1 |
| 2012/0067971 A1* | 3/2012 | Byun | C23C 16/45565 | 239/106 |
| 2012/0108076 A1* | 5/2012 | Goodlin | H01L 21/02104 | 438/758 |
| 2012/0234945 A1* | 9/2012 | Olgado | B05B 1/005 | 239/589 |
| 2013/0109159 A1* | 5/2013 | Carlson | C23C 16/45574 | 438/503 |
| 2013/0192761 A1* | 8/2013 | Yudovsky | B05C 13/00 | 156/345.55 |
| 2013/0210238 A1* | 8/2013 | Yudovsky | C23C 16/45551 | 438/758 |
| 2013/0298835 A1 | 11/2013 | Tam et al. | | |
| 2013/0299009 A1* | 11/2013 | Jiang | C23C 16/45578 | 137/334 |
| 2013/0333620 A1* | 12/2013 | Li | C23C 16/45563 | 118/728 |
| 2014/0083614 A1* | 3/2014 | Itonaga | G03F 7/36 | 156/345.33 |
| 2014/0103145 A1* | 4/2014 | White | C23C 16/45565 | 239/548 |
| 2014/0174362 A1* | 6/2014 | Kao | C23C 16/45536 | 118/723 R |
| 2014/0283747 A1* | 9/2014 | Kasai | H01J 37/3244 | 118/723 R |
| 2014/0370691 A1* | 12/2014 | Yamada | C23C 16/303 | 438/478 |
| 2015/0007770 A1* | 1/2015 | Chandrasekharan | C23C 16/45572 | 118/715 |
| 2015/0007771 A1* | 1/2015 | Silva | C23C 16/45574 | 118/715 |
| 2015/0131698 A1 | 5/2015 | Vellore et al. | | |
| 2015/0147889 A1* | 5/2015 | Yudovsky | H01L 21/0228 | 438/758 |
| 2015/0299856 A1* | 10/2015 | Li | H01L 21/0217 | 216/37 |
| 2015/0361553 A1* | 12/2015 | Murakawa | C23C 16/52 | 156/345.55 |
| 2015/0368798 A1* | 12/2015 | Kwong | C23C 16/45578 | 118/729 |
| 2016/0083844 A1* | 3/2016 | Nishitani | C23C 16/45574 | 118/719 |
| 2016/0273105 A1* | 9/2016 | de Ridder | C23C 16/45574 | |
| 2017/0159180 A1* | 6/2017 | Sawachi | C23C 16/455 | |

(56) References Cited

U.S. PATENT DOCUMENTS

2018/0230597 A1     8/2018   Ma et al.
2019/0035605 A1     1/2019   Suzuki
2019/0316255 A1*   10/2019   Shugrue ............ C23C 16/45544

* cited by examiner

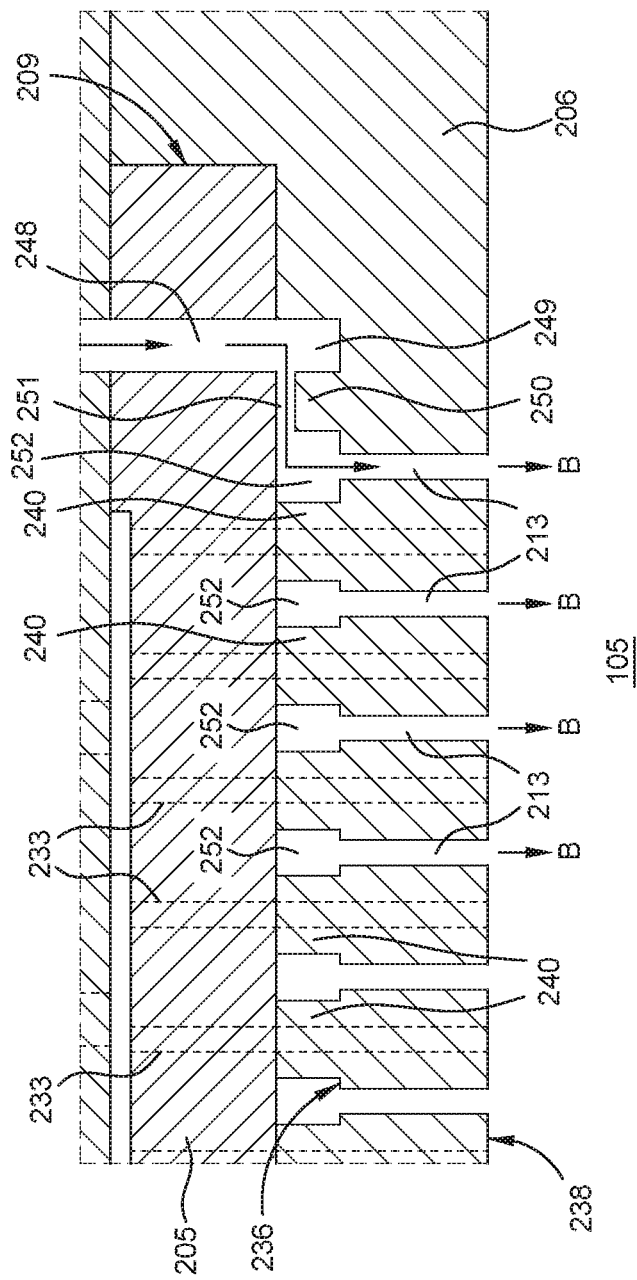

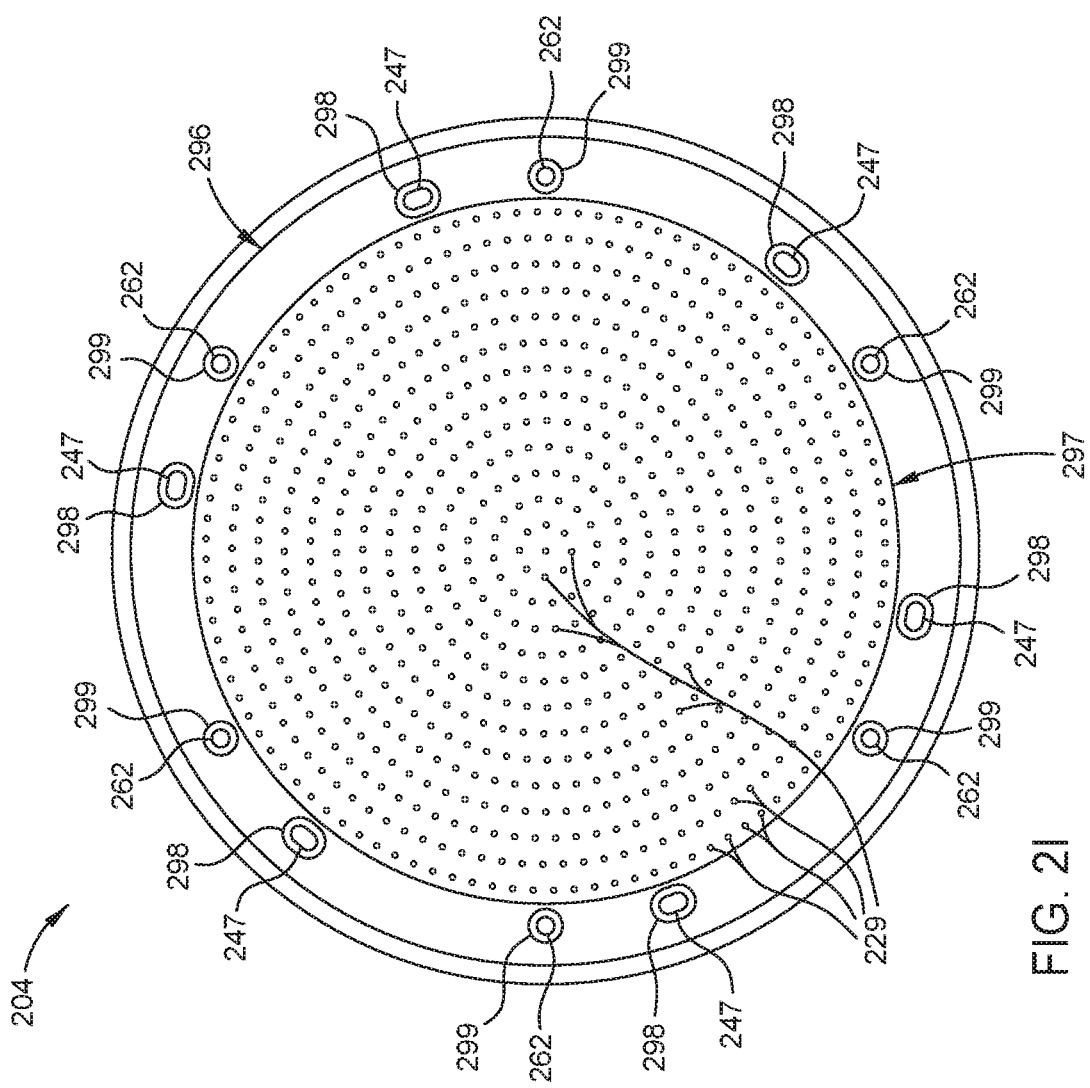

LID ASSEMBLY APPARATUS AND METHODS FOR SUBSTRATE PROCESSING CHAMBERS

BACKGROUND

Field

The present disclosure generally relates to a lid assembly apparatus and related methods for substrate processing chambers.

Description of the Related Art

Reactive gases are often used in the production of semiconductor devices. Some reactive gases, upon introduction to a chamber, will deposit a material upon substrates or sections of substrates. Certain gases break down easier and/or more quickly than other gases. For example some gases might break down easier and/or more quickly than other gases at certain temperatures. This results in inefficiency, waste, contamination, and reliability issues for substrate processing operations. For example, gases breaking down can cause reliability issues for a high-k dielectric that was deposited onto a semiconductor during substrate processing operations.

Therefore there is a need for an apparatus that delivers gases to the substrate processing chamber efficiently and reliably.

SUMMARY

The present disclosure relates to a lid assembly apparatus and related methods for substrate processing chambers.

In one implementation, a lid assembly includes a gas manifold. The gas manifold includes a first gas channel configured to receive a process gas, a second gas channel configured to receive a doping gas, and a third gas channel configured to receive a cleaning gas. The lid assembly also includes a showerhead. The showerhead includes one or more first gas openings that are configured to receive the process gas, and one or more second gas openings that are configured to receive the doping gas.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary implementations and are therefore not to be considered limiting of its scope, and may admit to other equally effective implementations.

FIG. 2E is an enlarged partial illustration of the showerhead illustrated in FIG. 2D, according to one implementation of the present disclosure.

FIG. 2I is a schematic top-view illustration of the first plate illustrated in FIG. 2A, according to one implementation of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
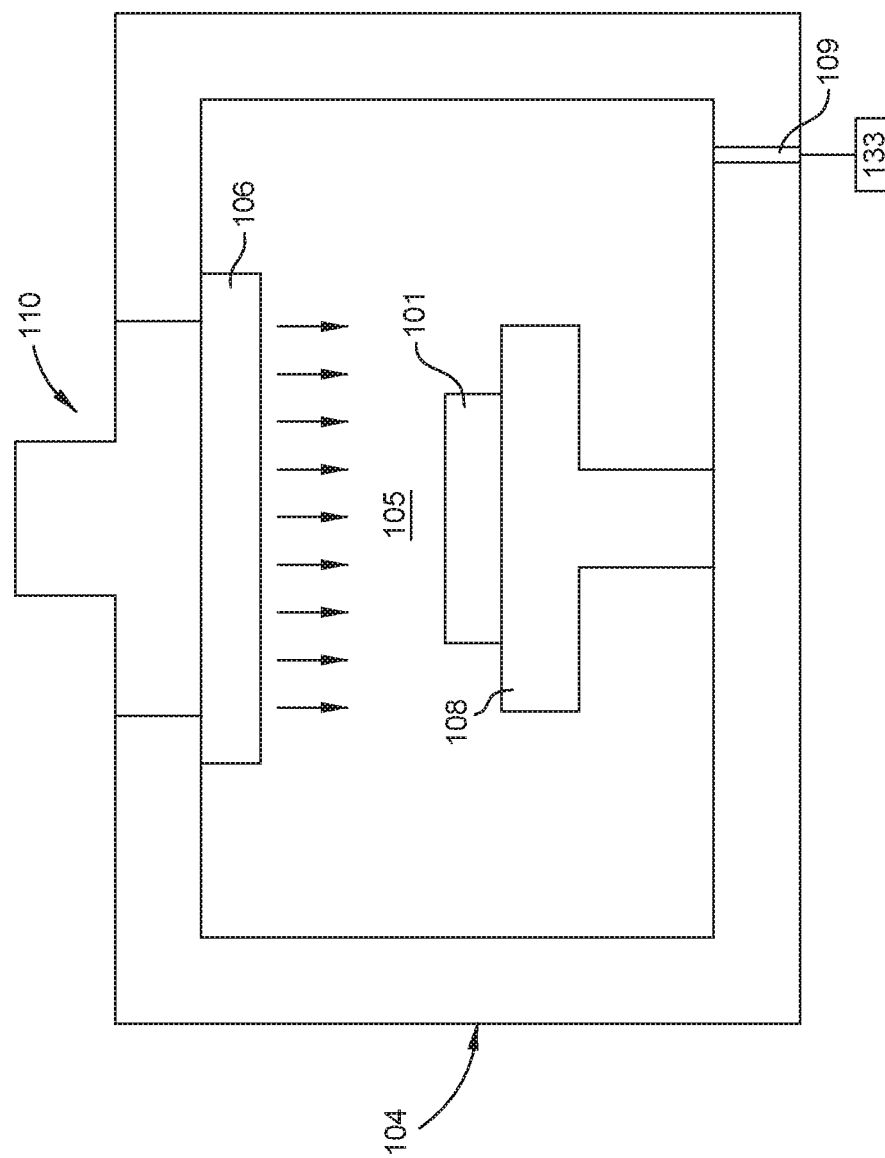
FIG. 1 is a schematic illustration of a substrate processing chamber, according to one implementation of the present disclosure.

The present disclosure relates to a lid assembly apparatus and related methods for substrate processing chambers. FIG. 1 is a schematic illustration of a substrate processing chamber 104, according to one implementation of the present disclosure. The substrate processing chamber 104 includes a pedestal 108 for supporting substrates 101 thereon.

The substrate processing chamber 104 includes a lid assembly 110. The lid assembly 110 is configured to introduce precursor gases and cleaning gases into a processing volume 105 of the substrate processing chamber 104. The lid assembly 110 includes a showerhead 106 that introduces gases into the processing volume 105. The precursor gases introduced into the processing volume 105 are configured to react on or above the substrate 101 for the purposes of depositing a material onto the substrate 101. The material deposited onto the substrate 101 may include a high-k dielectric material for the purposes of producing a semiconductor. Plasma is created in the processing volume 105 to facilitate deposition of the material onto the substrate 101. The substrate processing chamber 104 includes one or more energy sources that propagate radio frequency (RF) energy, direct current (DC) voltage, and/or alternating current (AC) throughout the substrate processing chamber 104 and/or components thereof. The substrate processing chamber 104 includes one or more heaters and/or one or more cooling channels, such as in the pedestal 108, that control the temperatures of various components and aspects of the substrate processing chamber 104.

The substrate processing chamber 104 includes an exhaust opening 109. The exhaust opening 109 is fluidly connected to a vacuum pump 133. The vacuum pump 133 is configured to exhaust gases from the processing volume 105 of the substrate processing chamber 104 through the exhaust opening 109.

Figure 2A:
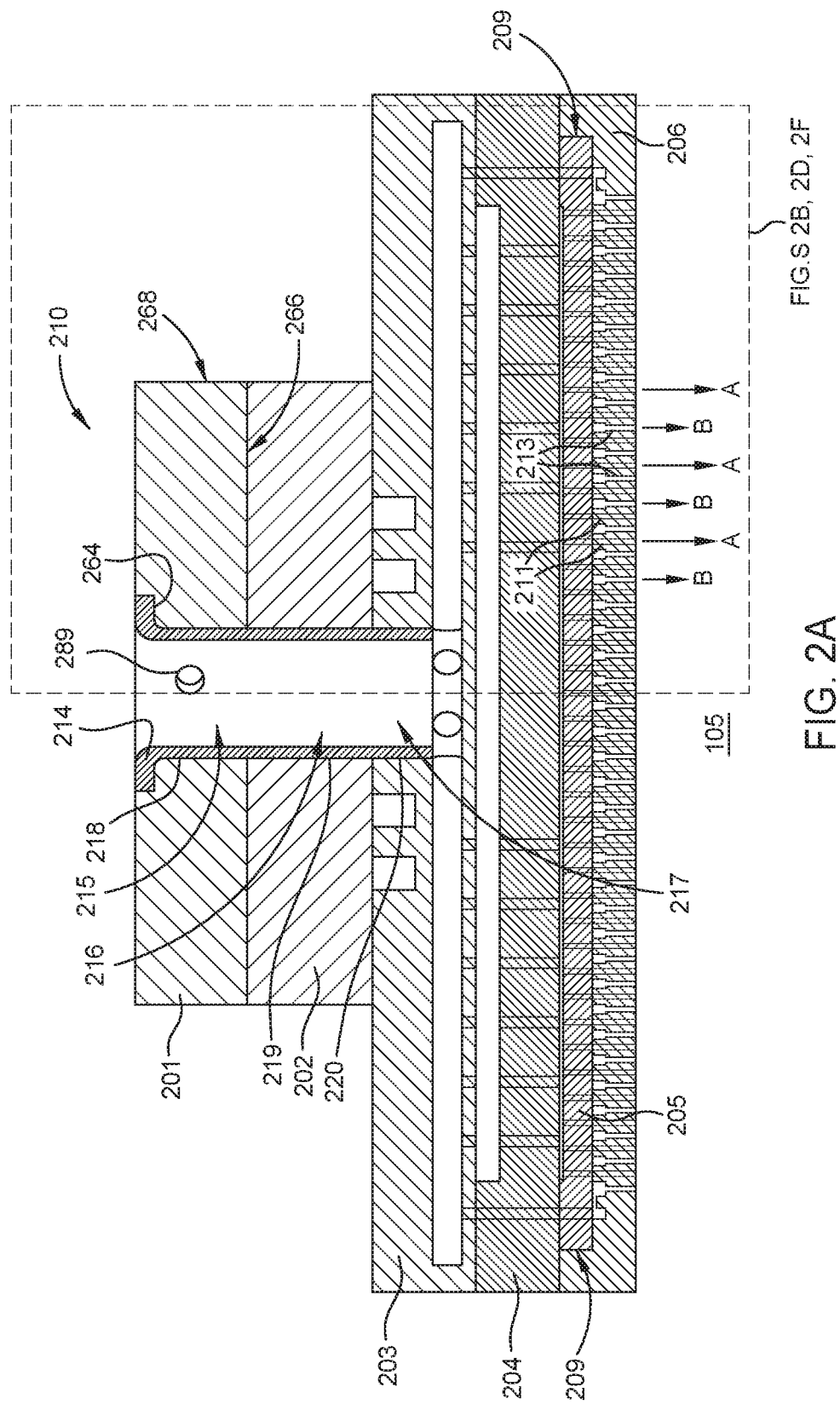
FIG. 2A is a schematic illustration of a lid assembly, according to one implementation of the present disclosure.

FIG. 2A is a schematic illustration of a lid assembly 210, according to one implementation of the present disclosure. One or more features, components, and/or aspects of the lid assembly 210 may be included in the lid assembly 110 and/or the showerhead 106 illustrated in FIG. 1.

The lid assembly 210 includes a gas manifold 201, an isolator manifold 202, a gas box 203, a first plate 204, a showerhead 206, and a second plate 205. The gas manifold 201 is configured to receive two or more precursor gases from two or more precursor gas sources, and is configured to receive one or more cleaning gases from one or more cleaning gas sources. The isolator manifold 202 is disposed under the gas manifold 201. The isolator manifold 202 is configured to electrically isolate components or aspects above the isolator manifold 202, such as the gas manifold 201, from components or aspects below the isolator manifold 202. For example, the isolator manifold is configured to electrically isolate the gas manifold 201 from one or more of RF energy, DC voltage, and/or AC current propagating throughout the processing volume 105. The gas box 203 is disposed under the gas manifold 201 and the isolator manifold 202. The first plate 204 is disposed under the gas box 203. In one example, the first plate 204 is a blocker plate. The showerhead 206 is disposed under the first plate 204. A second plate 205 is disposed between the showerhead 206 and the first plate 204. The second plate 205 is disposed within an inner shoulder 209 of the showerhead 206.

The showerhead 206 includes one or more first gas openings 211 and one or more second gas openings 213. The first gas openings 211 are configured to introduce a first gas A into a processing volume 105 (illustrated in FIG. 1). The second gas openings 213 are configured to introduce a second gas B into the processing volume 105. The first gas A enters the lid assembly 210 through the gas manifold 201 and exits the lid assembly 210 through the first gas openings 211 of the showerhead 206. The second gas B enters the lid assembly 210 through the gas manifold 201 and exits the lid assembly 210 through the second gas openings 213 of the showerhead 206.

As an example, the first gas A includes a process gas. The process gas includes one or more of silane and/or disilane. The second gas B includes a doping gas. The doping gas includes one or more of boron, phosphine, fluorine, arsenic, and/or nitrogen trifluoride. However, other gases are also contemplated.

The lid assembly 210 and the showerhead 206 are configured such that the first gas A and the second gas B are separated until the first gas A exits the showerhead 206 through the first gas openings 211 and the second gas B exits the showerhead 206 through the second gas openings 213. The first gas A and the second gas B do not mix until the first gas A and the second gas B reach the processing volume 105. These configurations allow the respective densities of the first gas A and the second gas B to be relatively high, resulting in reliable mixing of the first gas A and the second gas B in the processing volume 105 and adjacent to a substrate being processed (such as substrate 101).

These configurations also prevent or mitigate the effects of one of first gas A and second gas B completely or partially breaking down before or faster than the other of first gas A and second gas B. In an example where first gas A includes a process gas and second gas B includes a doping gas, the doping gas may break down earlier or faster than the process gas at a certain temperature. These configurations prevent or mitigate the effects of the doping gas breaking down relative to the process gas by keeping the process gas and doping gas separate until the process gas and the doping gas exit the showerhead 206 of the lid assembly 210. By separating the first gas A and the second gas B, reactions between first gas A and second gas B can be prevented until first gas A and second gas B reach the processing volume 105. As an example, reactions between first gas A and second gas B can be prevented until right above the surface of a substrate (such as the surface of substrate 101 that faces the showerhead 106 illustrated in FIG. 1). This achieves increased efficiency, less waste, and reliable deposition of films onto substrates.

The lid assembly 210 includes an insulator 214. The insulator 214 is disposed in a central opening 215 of the gas manifold 201, a central opening 216 of the isolator manifold 202, and a central opening 217 of the gas box 203. The insulator 214 includes a ceramic shield. In one example, the insulator 214 includes aluminum nitride. The insulator 214 reduces or prevents heat buildup and/or radical buildup on an inner surface 218 of the gas manifold 201, an inner surface 219 of the isolator manifold 202, and an inner surface 220 of the gas box 203. The insulator 214 includes an opening 289 that corresponds to the third gas channel 253 illustrated in FIG. 2F.

Figure 2B:
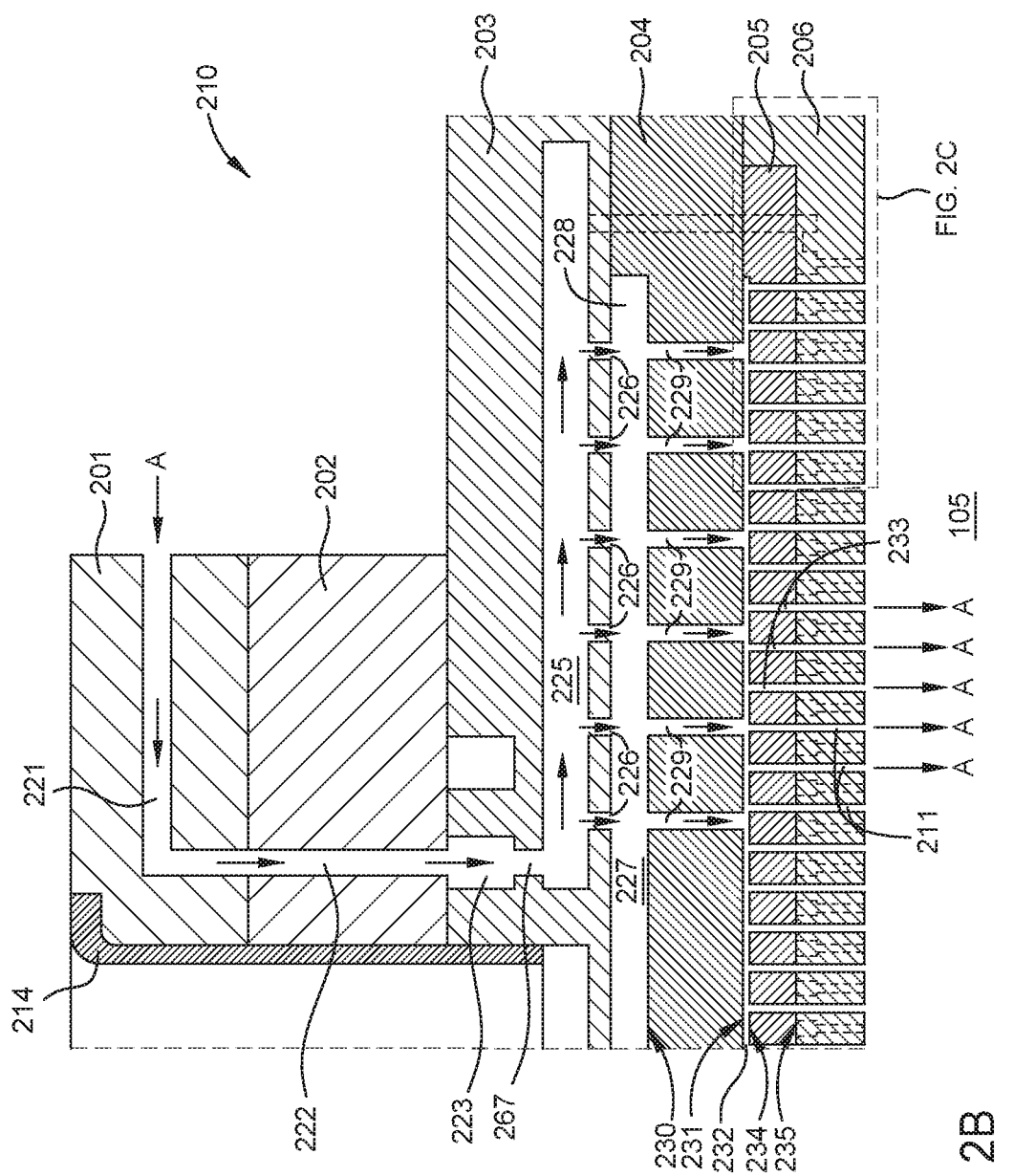
FIG. 2B is an enlarged partial illustration of the lid assembly illustrated in FIG. 2A, according to one implementation of the present disclosure.

FIG. 2B is an enlarged partial illustration of the lid assembly 210 illustrated in FIG. 2A, according to one implementation of the present disclosure. The gas manifold 201 is configured to receive the first gas A through a first gas channel 221 of the gas manifold 201. The first gas channel 221 is fluidly connected to a first gas channel 222 of the isolator manifold 202. The isolator manifold 202 is configured to receive the first gas A through the first gas channel 222. The first gas channel 222 is fluidly connected to a first gas opening 223 of the gas box 203. The gas box 203 is configured to receive the first gas A through the first gas opening 223. The first gas opening 223 of the gas box 203 is fluidly connected to a first gas channel 225 of the gas box 203.

The first gas channel 225 includes one or more first gas openings 226 (six are shown) that are configured to deliver the first gas A from the first gas channel 225 and into a plenum 227 of the first plate 204. The plenum 227 is defined by a recess 228 of the first plate 204 and the gas box 203. The recess 228 defines a first surface 230 of the first plate 204. The first plate also includes a second surface 231. The first plate 204 includes one or more first gas openings 229 that extend from the first surface 230 to the second surface 231 of the first plate 204. The first gas openings 229 are fluidly connected to a plenum 232 that is between the second surface 231 of the first plate 204 and the second plate 205. The first gas openings 229 are configured to deliver first gas A from the plenum 227 and into the plenum 232 between the first plate 204 and the second plate 205.

The second plate 205 includes one or more first gas openings 233 that extend from a first surface 234 of the second plate 205 to a second surface 235 of the second plate 205. In one example, one or more of the first gas openings 229 of the first plate 204 is aligned with one or more of the first gas openings 226 of the first gas channel 225 of the gas box 203. In one example, one or more of the first gas openings 229 of the first plate 204 is aligned with one or more of the first gas openings 233 of the second plate 205.

The first gas openings 233 of the second plate 205 are configured to deliver the first gas A from the plenum 232 and into the first gas openings 211 of the showerhead 206.

Figure 2C:
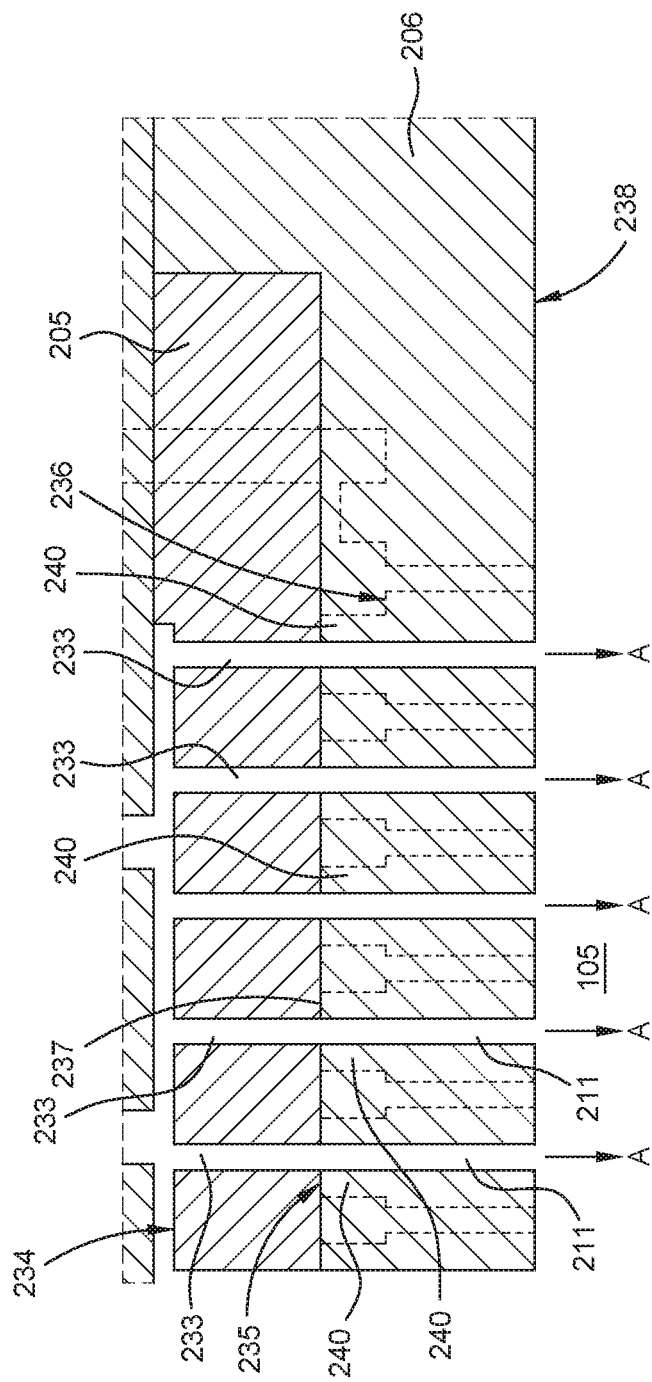
FIG. 2C is an enlarged partial illustration of the showerhead illustrated in FIG. 2B, according to one implementation of the present disclosure.

FIG. 2C is an enlarged partial illustration of the showerhead 206 illustrated in FIG. 2B, according to one implementation of the present disclosure. The showerhead 206 includes one or more bosses 240 that protrude from a first surface 236 of the showerhead 206. The first gas openings 211 extend from a boss surface 237 to a second surface 238 of the showerhead 206. The second surface 238 faces the processing volume 105 and is exposed thereto. The boss surfaces 237 of the bosses 240 contact the second surface 235 of the second plate 205. In one example, one or more of the first gas openings 233 of the second plate 205 is aligned with one or more of the first gas openings 211 of the showerhead 206.

As illustrated in FIGS. 2B and 2C, the first gas channel 221 of the gas manifold 201 is fluidly connected to the showerhead 206 and the processing volume 105. The lid assembly 210 delivers the first gas A from a first gas source and into the processing volume 105.

Figure 2D:
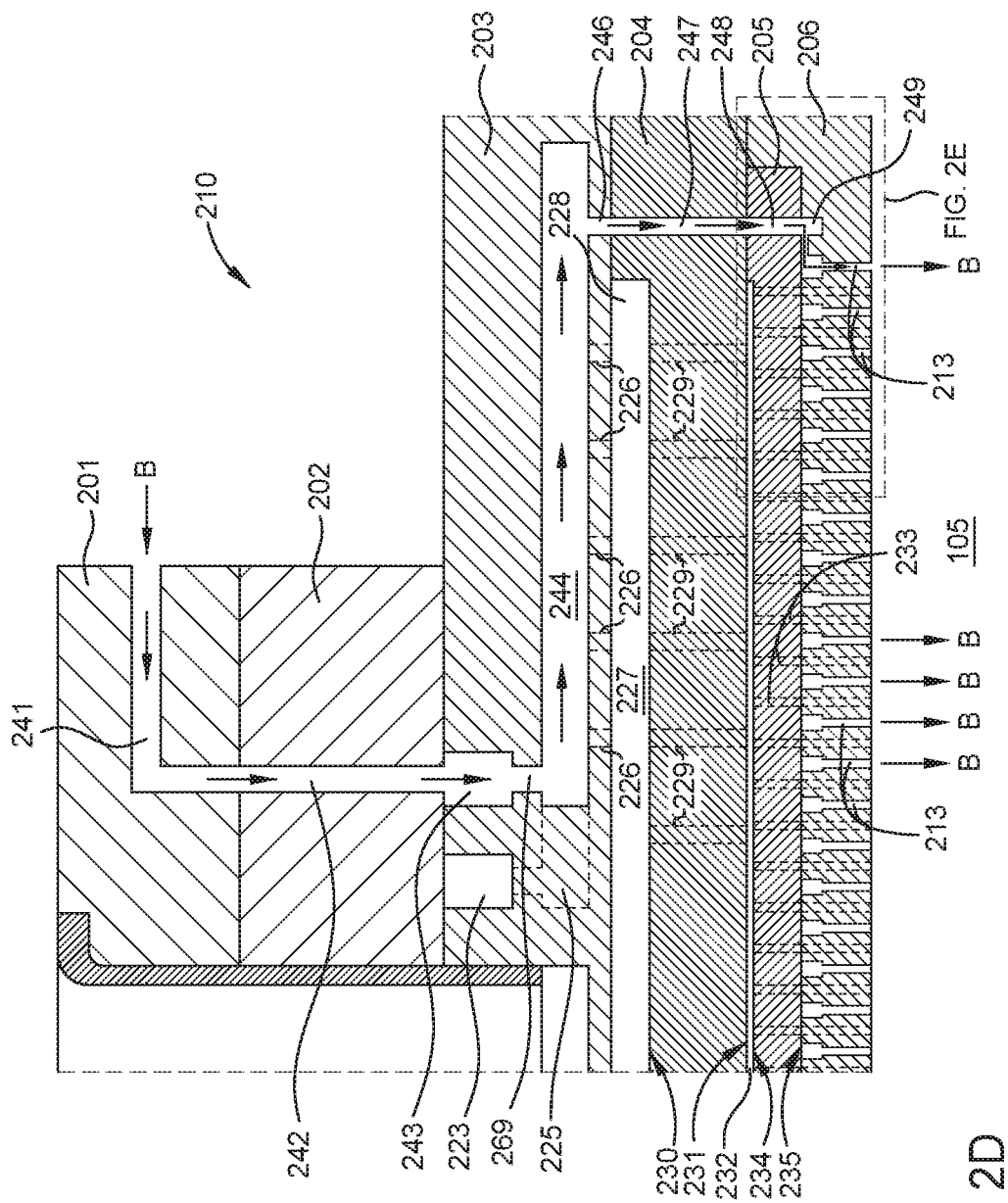
FIG. 2D is an enlarged partial illustration of the lid assembly illustrated in FIG. 2A, according to one implementation of the present disclosure.

FIG. 2D is an enlarged partial illustration of the lid assembly 210 illustrated in FIG. 2A, according to one implementation of the present disclosure. The gas manifold 201 is configured to receive the second gas B through a second gas channel 241. The second gas channel 241 is separate and distinct from the first gas channel 221 illustrated in FIG. 2B. The second gas channel 241 is configured to deliver the second gas B to a second gas channel 242 of the isolator manifold 202. The second gas channel 242 is separate and distinct from the first gas channel 222 of the isolator manifold 202. The second gas channel 242 is configured to deliver the second gas B from the second gas channel 241 of the gas manifold 201 and into a second gas opening 243 of the gas box 203. The second gas opening 243 is configured to deliver the second gas B into a second gas channel 244 of the gas box 203. The second gas opening 243 is disposed radially outward of the first gas opening 223 of the gas box 203.

The second gas channel 244 off the gas box 203 is separate and distinct from the first gas channel 25 illustrated in FIG. 2B. The second gas channel 244 includes one or more second gas openings 246. The second gas openings 246 of the second gas channel 244 are disposed radially outside of the first gas openings 226 of the first gas channel 225. The second gas openings 246 are configured to deliver the second gas B from the second gas channel 244 and into a second gas opening 247 of the first plate 204. The second gas opening 247 is disposed radially outside of the first gas openings 229 illustrated in FIG. 2B. In one example, the second gas opening 247 is aligned with the second gas opening 246 of the second gas channel 244.

The second gas opening 247 of the first plate 204 is configured to deliver the second gas B from the gas box 203 and into a second gas opening 248 of the second plate 205. In one example, the second gas opening 247 of the first plate 204 is aligned with the second gas opening 248 of the second plate 205.

FIG. 2E is a partially-enlarged illustration of the showerhead 206 illustrated in FIG. 2D, according to one implementation of the present disclosure. The second gas opening 248 of the second plate 205 is configured to deliver the second gas B from the second plate 205 and to a second gas channel 249 of the showerhead 206. The second gas opening 248 is disposed radially outside of the first gas openings 233 of the second plate 205. The second gas channel 249 is disposed radially outside of the bosses 240 and the first surface 236. A wall 250 is disposed between the first surface 236 and the second gas channel 249. The wall 250 includes one or more wall openings 251 that are configured to deliver the second gas B from the second gas channel 249 and into one or more gaps 252 that are disposed around and between the bosses 240. The second gas openings 213 of the showerhead 206 extend from the first surface 236 to the second surface 238. The second gas openings 213 are configured to deliver the second gas B from the gaps 252 and into the processing volume 105.

As illustrated in FIGS. 2D and 2E, the second gas channel 241 of the gas manifold 201 is fluidly connected to the showerhead 206 and the processing volume 105. The lid assembly 210 delivers the second gas B from a second gas source and into the processing volume 105. The lid assembly 210 keeps the flow of the first gas A separate from the flow of the second gas B until first gas A and first gas B are introduced into the processing volume 105. As an example, the boss surfaces 237 of the bosses 240 contact the second surface 235 and seal thereagainst. The bosses 240 thus fluidly separate the first gas A flowing through the first gas openings 211 from the second gas B flowing through the gaps 252 and the second gas openings 213.

By keeping first gas A separate from second gas B, the lid assembly 210 facilitates mixing first gas A and second gas B in the processing volume 105 near the substrate 101 (illustrated in FIG. 1). Mixing the first gas A and second gas B in the processing volume 105 facilitates reliable and efficient deposition of films onto the substrate 101. The first gas A and second gas B do not mix prior to entering the processing volume 105, mitigating or eliminating the effects of one or first gas A or second gas B breaking down relative to the other of first gas A or second gas B. For example, reducing the amount of a reactant gas that is broken down ensures that the reactant gas reaches the processing volume 105 at a density that facilitates mixing with another reactant gas to deposit a film onto a substrate.

Figure 2F:
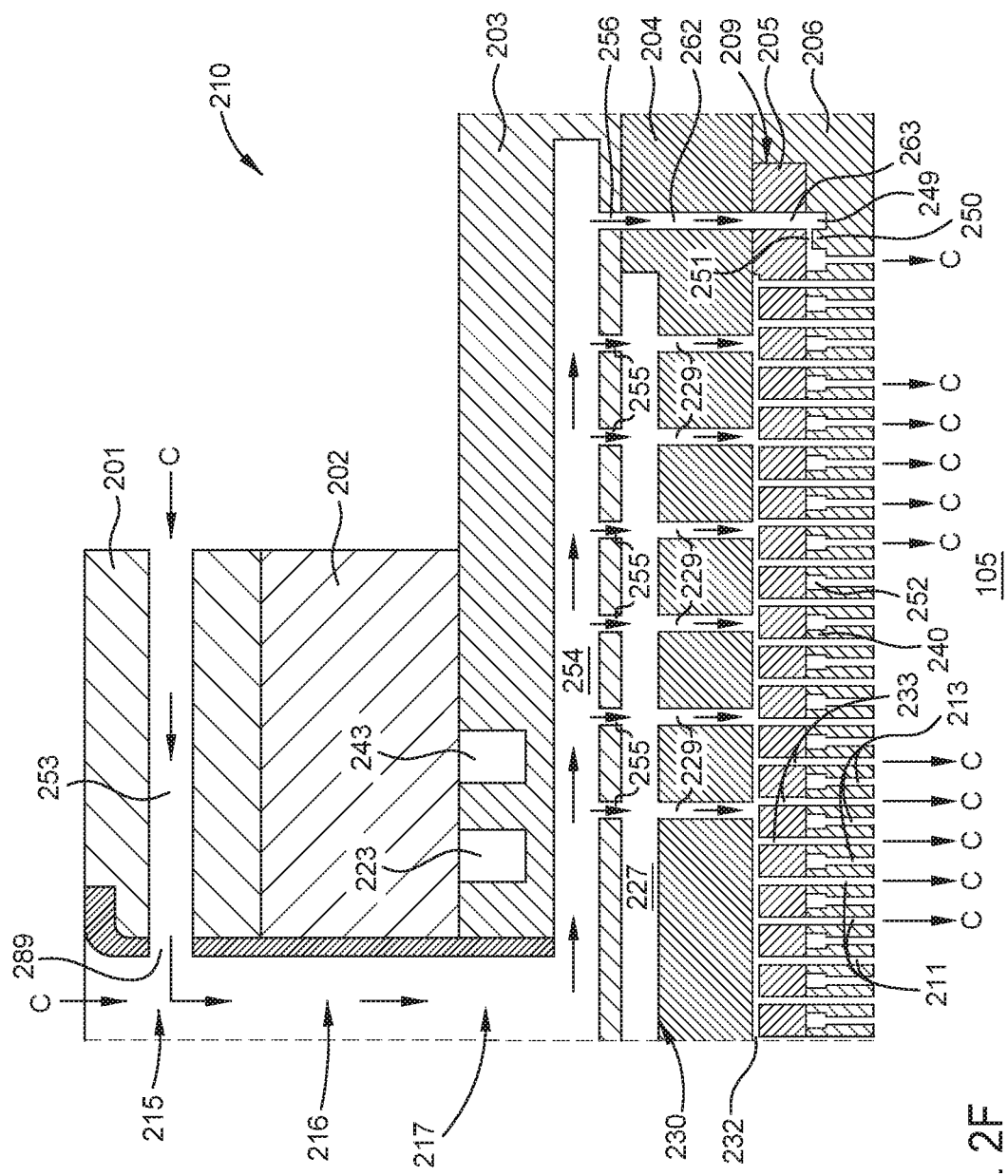
FIG. 2F is an enlarged partial illustration of the lid assembly illustrated in FIG. 2A, according to one implementation of the present disclosure.

FIG. 2F is a partially-enlarged illustration of the lid assembly 210 illustrated in FIG. 2A, according to one implementation of the present disclosure. The gas manifold 201 is configured to receive a third gas C into a third gas channel 253. The third gas channel 253 is separate and distinct from the first gas channel 221 and the second gas channel 241. The gas manifold 201 receives the third gas C from a third gas source. The third gas C is a cleaning gas, which may be activated by a remote plasma source (RPS) prior to introduction to the third gas channel 253. In one example, the third gas C includes one or more carrier and/or cleaning gases such as argon, nitrogen trifluoride, and/or oxygen.

The third gas C can also be received by the gas manifold 201 into the central opening 215 from a third gas source that is above the central opening 215. In one example, the third gas C that is received by the third gas channel 253 bypasses an RPS and is not activated by the RPS, and the third gas C received by the central opening 215 passes through and is activated by the RPS.

The third gas channel 253 is configured to deliver the third gas C into the central opening 215 of the gas manifold 201, the central opening 216 of the isolator manifold 202, and the central opening 217 of the gas box 203. The gas box 203 is configured to deliver the third gas C from the central opening 217 and into a third gas channel 254 of the gas box 203. The lid assembly 210 is hence configured such that the third gas C bypasses the isolator manifold 202, the first gas opening 223 of the gas box 203, and the second gas opening 243 of the gas box 203. These configurations allow for a simple design of the gas box 203 and for large flow rates of third gas C to flow through the central opening 215 of the gas manifold 201.

The third gas channel 254 of the gas box 203 is separate and distinct from the first gas channel 225 and the second gas channel 244. The third gas channel 254 includes one or more first openings 255 that are configured to deliver the third gas C from the second gas channel 244 and into the plenum 227 between the gas box 203 and the first plate 204.

The third gas channel 254 includes one or more second openings 256 that are disposed radially outside of the first openings 255. The second openings 256 are configured to deliver the third gas C from the third gas channel 254 and into a third gas opening 262 of the first plate 204. The third gas opening 262 is separate and distinct from the second gas opening 247 of the first plate 204. In one example, the third gas opening 262 is aligned with one or more of the second openings 256 of the third gas channel 254.

One or more purge gases may be flowed through the lid assembly 210 to prevent backflow of the first gas A, second gas B, and/or the third gas C. As an example, purge gas may be flowed to prevent fluid (such as first gas A) from flowing from the plenum 227 and into the third gas channel 254. As another example, purge gas may be flowed to prevent fluid (such as second gas B) from flowing from the second gas channel 249 and into the third gas openings 263. The present disclosure also contemplates that the lid assembly 210 may include one or more valves to prevent backflow. As an example, one or more of each of the first openings 255, first gas openings 226, second gas openings 246, third gas openings 263, and/or third gas openings 262 may include valves. In one example, the valves include check valves or some other valve.

The first plate 204 is configured to deliver the third gas C from the plenum 227 and into one or more first gas openings 229. The first gas openings 229 are configured to deliver the third gas C from the plenum 227 and into the plenum 232 between the first plate 204 and the second plate 205. One or more first gas openings 233 of the second plate 205 are configured to deliver the third gas C from the plenum 232 and into the first gas openings 211 of the showerhead 206. The first gas openings 211 are configured to introduce the third gas C into the processing volume 105.

The third gas opening 262 of the first plate 204 is configured to deliver the third gas C into a third gas opening 263 of the second plate 205. The third gas opening 263 is separate and distinct from the second gas opening 248 of the second plate 205. The third gas opening 263 is configured to deliver the third gas C into the second gas channel 249 of the showerhead 206. In one example, the third gas opening 263 of the second plate 205 is aligned with the third gas opening 262 of the first plate 204.

The showerhead 206 is configured to deliver the third gas C, from the second gas channel 249, and through one or more wall openings 251 of the wall 250 and into the gaps 252 disposed between and around the bosses 240 of the showerhead 206. The showerhead is configured to deliver the third gas C from the gaps 252 and into the processing volume 105 through the one or more second gas openings 213.

Hence, the lid assembly 210 is configured to deliver the third gas C through flow paths that the first gas A and the second gas B flow through, respectively, in the first plate 204, second plate 205, and the showerhead 206. In examples where the third gas C is a cleaning gas, the lid assembly 210 can effectively, efficiently, and simultaneously clean the fluid paths for first gas A and second gas B. The lid assembly 210 can keep the flow paths for first gas A and second gas B separate prior to mixing the first gas A and the second gas B in the processing volume 105. The lid assembly 210 can also clean fluid paths for first gas A and second gas B simultaneously.

Figure 2G:
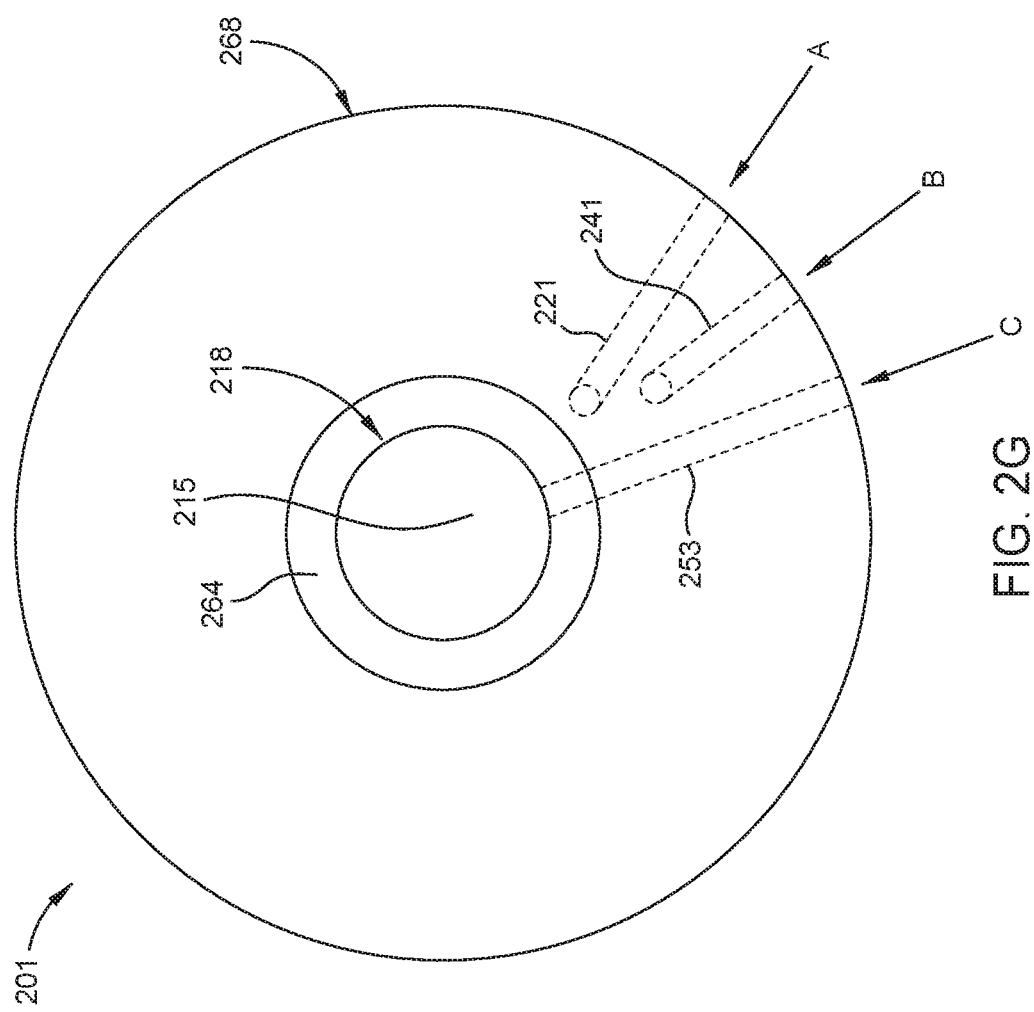
FIG. 2G is a schematic top-view illustration of the gas manifold illustrated in FIG. 2A, according to one implementation of the present disclosure.

FIG. 2G is a schematic top-view illustration of the gas manifold 201 illustrated in FIG. 2A, according to one implementation of the present disclosure. The gas manifold 201 includes a shoulder 264 disposed adjacent to the central opening 215. The shoulder 264 supports the insulator 214 illustrated in FIG. 2A. The first gas channel 221, second gas channel 241, and third gas channel 253 are separate and distinct, and are disposed in a spaced-apart relation from each other in the gas manifold 201. The first gas channel 221 runs from an outer surface 268 of the gas manifold 201 to a bottom surface 266 of the gas manifold 201. The second gas channel 241 runs from the outer surface 268 of the gas manifold 201 to the bottom surface 266 of the gas manifold 201. The third gas channel 253 runs from the outer surface 268 to the inner surface 218 of the gas manifold 201.

Figure 2H:
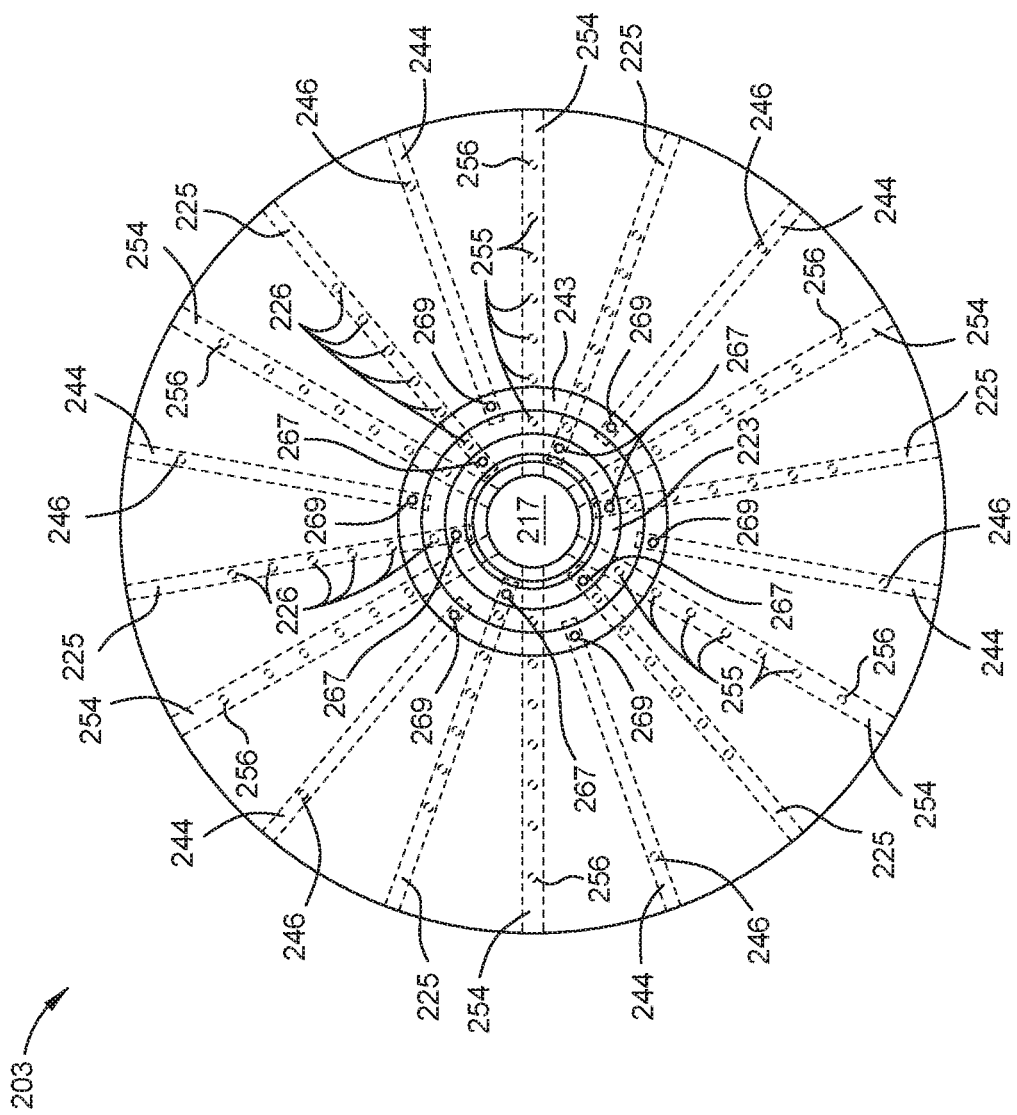
FIG. 2H is a schematic top-view illustration of the gas box illustrated in FIG. 2A, according to one implementation of the present disclosure.

FIG. 2H is a schematic top-view illustration of the gas box 203 illustrated in FIG. 2A, according to one implementation of the present disclosure. The gas box 203 includes first gas channels 225, second gas channels 244, and third gas channels 254 that are separate and distinct. The first gas channels 225, second gas channels 244, and third gas channels 254 are disposed at a spaced-apart relation from each other in an alternating arrangement. One or more of each of the first gas channels 225, second gas channels 244, and/or third gas channels 254 may be disposed in different vertical planes in the gas box 203. In the implementation illustrated in FIG. 2F, the third gas channel 254 is disposed vertically below the first gas channel 225 illustrated in FIG. 2B and the second gas channel 244 illustrated in FIG. 2D. The present disclosure also contemplates that one or more of each of the first gas channels 225, second gas channels 244, and/or third gas channels 254 may be disposed in the same vertical plane in the gas box 203. In the implementation illustrated in FIG. 2D, the second gas channel 244 is disposed in the same vertical plane as the first gas channel 225.

The first gas channels 225 each include one or more first gas openings 226 arranged in a linear arrangement extending radially outward. The second gas channels 244 each include one or more second gas openings 246 that are disposed radially outside of the first gas openings 226 of the first gas channels 225. The third gas channels 254 each include one or more first openings 255 and one or more second openings 256 arranged in a linear arrangement extending radially outward. The second openings 256 are disposed radially outside of the first openings 255 and the first gas openings 226 of the first gas channels 225.

The first gas opening 223 is disposed circumferentially about the central opening 217 of the gas box 203, and radially outside of the central opening 217. The first gas opening 223 includes one or more first gas ports 267 that are configured to deliver first gas A from the first gas opening 223 and into the first gas channels 225.

The second gas opening 243 is disposed circumferentially about the first gas opening 223 of the gas box 203, and radially outside of the first gas opening 223. The second gas opening 243 includes one or more second gas ports 269 that are configured to deliver second gas B from the second gas opening 243 and into the second gas channels 244.

The third gas channels 254 are open to the central opening 217 of the gas box 203. The gas box 203 is configured to deliver the third gas C from the central opening 217 and into the third gas channels 254.

FIG. 2I is a schematic top-view illustration of the first plate 204 illustrated in FIG. 2A, according to one implementation of the present disclosure. In one example, the first plate 204 is a blocker plate. The first gas openings 229 are disposed in a concentric circular pattern on the first plate 204, as illustrated in FIG. 2I. The first plate 204 includes second gas openings 247 and third gas openings 262 disposed circumferentially on the first plate 204 in an alternating arrangement. The second gas openings 247 and the third gas openings 262 are disposed radially outside of the first gas openings 229. The second gas openings 247 are oblong in shape. The third gas openings 262 and the first gas openings 229 are circular in shape. Each of the second gas openings 247 corresponds to a second gas opening 246 of a second gas channel 244 of the gas box 203. Each of the third gas openings 262 corresponds to a second opening 256 of a third gas channel 254 of the gas box 203. The second gas openings 247 and third gas openings 262 are disposed in first bosses 298 and second bosses 299, respectively. The first bosses 298 and second bosses 299 protrude from the first plate 204. The first plate 204 includes an inner shoulder 297 and an outer shoulder 296.

Figure 2J:
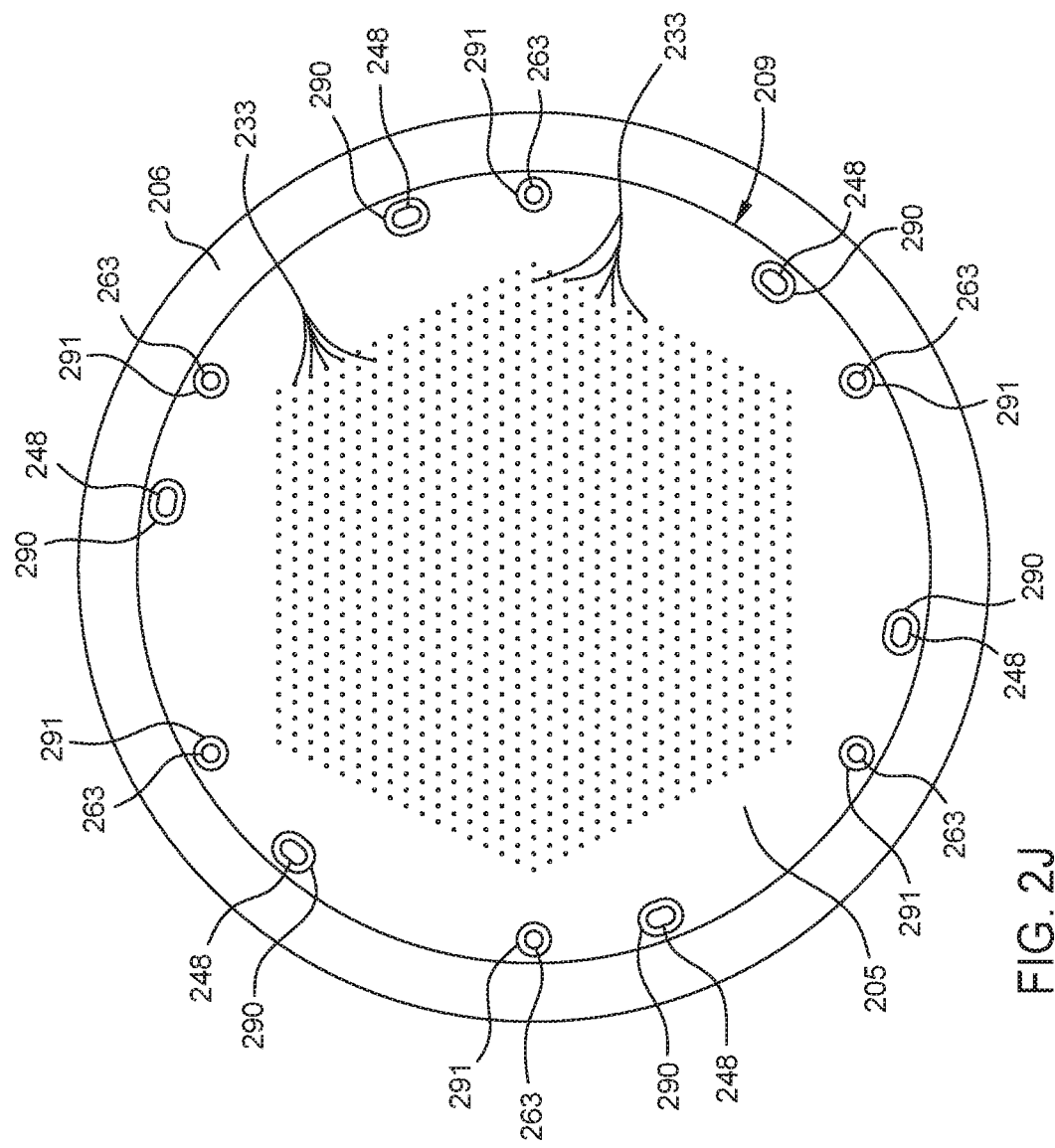
FIG. 2J is a schematic top-view illustration of the second plate and the showerhead illustrated in FIG. 2A, according to one implementation of the present disclosure.

FIG. 2J is a schematic top-view illustration of the second plate 205 and the showerhead 206 illustrated in FIG. 2A, according to one implementation of the present disclosure. The second plate 205 is disposed within the inner shoulder 209 of the showerhead 206. The first gas openings 233 are disposed in a hexagonal pattern on the second plate 205, as illustrated in FIG. 2J. Second gas openings 248 and third gas openings 263 are disposed circumferentially on the second plate 205 in an alternating arrangement. The second gas openings 248 and the third gas openings 263 are disposed radially outside of the first gas openings 233. The second gas openings 248 are oblong in shape. The first gas openings 233 and the third gas openings 263 are circular in shape. The second gas openings 248 correspond to the second gas openings 247 of the first plate 204. The third gas openings 263 correspond to the third gas openings 262 of the first plate 204. The second gas openings 248 and the third gas openings 263 are disposed in first bosses 290 and second bosses 291, respectively. The first bosses 290 and the second bosses 291 protrude from the second plate 205.

The present disclosure contemplates that the ports, openings, and/or channels disclosed herein may be a variety of shapes, such as circular or oblong. The shapes of the ports, openings, and/or channels may be used to accommodate various flow rates of the first gas A, second gas B, and/or third gas C, and may be used to facilitate producing seals between components or features of lid assembly 210. As an example, the second gas openings 247 of the first plate 204 are illustrated as oblong in shape in FIG. 2I to accommodate various flow rates of second gas B. The oblong shape of second gas openings 247 may be used to increase the cross-sectional areas of second gas openings 247 to facilitate accommodation of increased flow rates of second gas B. The oblong shape of second gas openings 247 can facilitate accommodation of increased flow rates of second gas B without the first bosses 298 interfering with a seal between the outer shoulder 296 and the inner shoulder 297. The oblong shape of the second gas openings 247 also facilitates producing a seal between one or more aspects of gas box 203 and one or more aspects of first plate 204, such as to prevent second gas B from flowing into the plenum 227.

The shapes and sizes of the openings, channels, and/or ports disclosed herein may be modified based on process requirements for the substrate 101, substrate processing chamber 104, first gas A, second gas B, and/or third gas C.

Figure 2L:
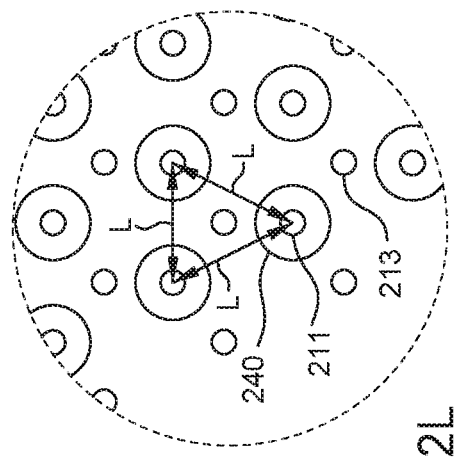
FIG. 2L is a partially-enlarged view of the showerhead illustrated in FIG. 2K.
Figure 2K:
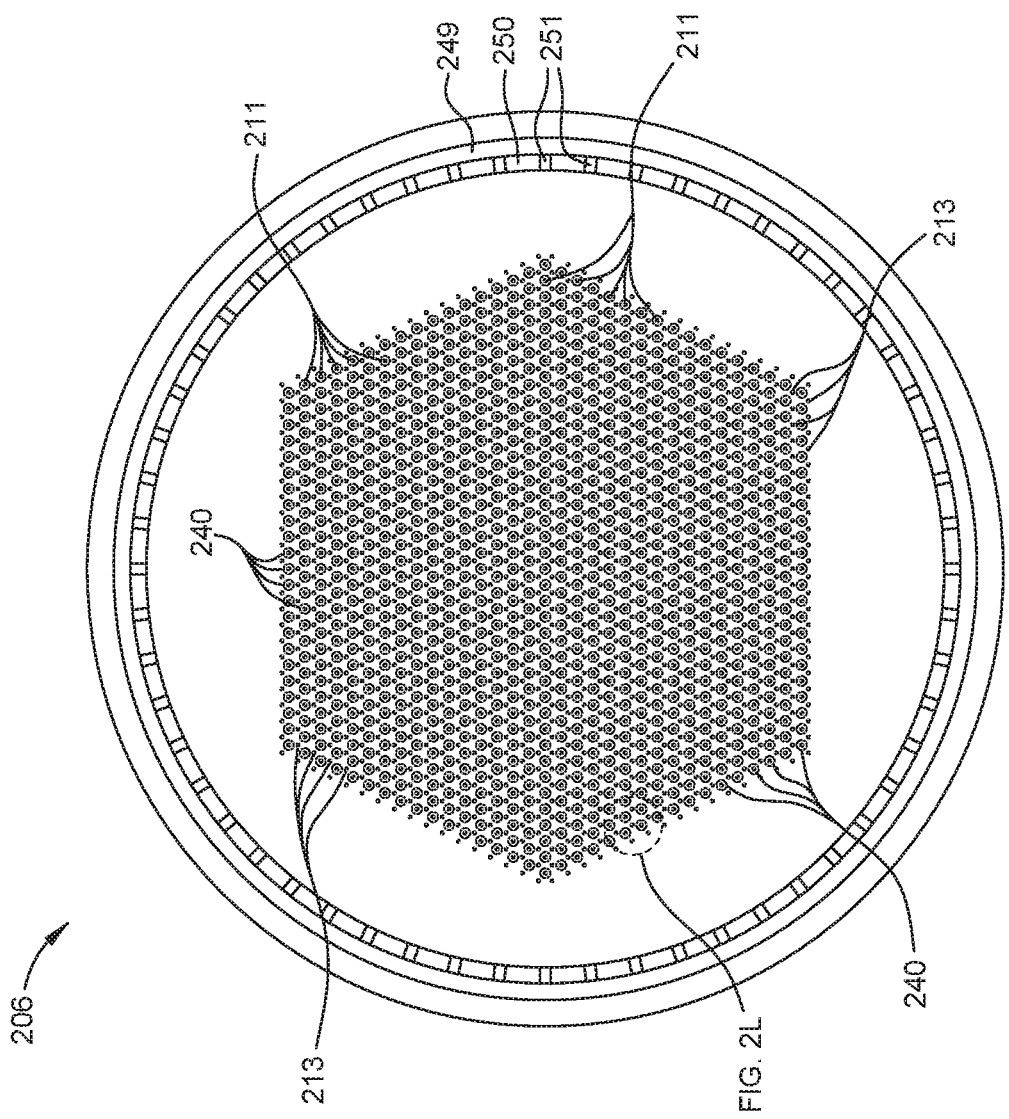
FIG. 2K is a schematic top-view illustration of the showerhead illustrated in FIG. 2A, according to one implementation of the present disclosure.

FIG. 2K is a schematic top-view illustration of the showerhead 206 illustrated in FIG. 2A, according to one implementation of the present disclosure. The showerhead 206 includes the second gas channel 249 disposed circumferentially around the first gas openings 211, bosses 240, and second gas openings 213. The second gas openings 213 are disposed around and between the bosses 240. The second gas openings 213 are separated from the second gas channel 249 by the wall 250. Wall openings 251 allow the second gas B to flow from the second gas channel 249 to the second gas openings 213.

In one example, the bosses 240 and the first gas openings 211 are disposed in a hexagonal arrangement on the showerhead 206, as illustrated in FIG. 2K.

FIG. 2L is a partially-enlarged view of the showerhead 206 illustrated in FIG. 2K. The bosses 240 are disposed at a density such that respective centers of the bosses 240 are disposed at a distance L from each other. In one example, the distance L is within a range of about 0.0 inches to about 0.7 inches, such as about 0.34 inches to about 0.63 inches, such as about 0.34 inches or about 0.63 inches.

Although the present disclosure illustrates openings, ports, and channels in various orientations and configurations, the present disclosure contemplates that other orientations and/or configurations are possible. For example, the present disclosure contemplates that the plates, showerhead, manifolds, gas box, openings, ports, and/or channels disclosed herein can involve various shapes, sizes, numbers of iterations, lengths, dimensions, vertical orientations, horizontal orientations, and/or angled orientations. As an example, the number of second gas openings 213 on the showerhead 206 can be varied. The second gas openings 213 can also be disposed at various angles or can vary in shape, length, and/or size.

The present disclosure also contemplates that the first gas A, second gas B, and third gas C may be flowed through the lid assembly 210 and/or into the processing volume 105 at various specified temperatures, pressures, flow rates, and/or molecular weights.

Benefits of the present disclosure include keeping gases separate until they reach a processing volume; mixing reactant gases above a substrate; high density mixing of gases; simultaneously cleaning separate flow paths; reliable and efficient deposition of a material onto a substrate, and reducing or preventing heat buildup and/or radical buildup on a lid assembly.

Aspects of the present disclosure include a lid assembly that separates gases prior to introducing the gases into a processing volume; a gas manifold with a first gas channel, a second gas channel, and a third gas channel; a gas box; a showerhead with first gas openings, second gas openings, bosses, and gaps; and an insulator.

It is contemplated that one or more of these aspects disclosed herein may be combined. Moreover, it is contemplated that one or more of these aspects may include some or all of the aforementioned benefits.

While the foregoing is directed to embodiments of the present disclosure, other and further embodiments of the disclosure may be devised without departing from the basic scope thereof. The present disclosure also contemplates that one or more aspects of the embodiments described herein may be substituted in for one or more of the other aspects described. The scope of the disclosure is determined by the claims that follow.

What is claimed is:

1. A lid assembly, comprising:
a gas manifold, the gas manifold comprising:
   a first gas channel configured to receive a first gas defining a portion of a first gas path;
   a second gas channel configured to receive a second gas, defining a portion of a second gas path, the second gas path fluidly isolated from the first gas channel; and
   a third gas channel configured to receive a third gas, the third gas channel defining a portion of a third gas path;
   a gas manifold central opening forming a portion of the third gas path and fluidly coupled to the third gas channel;
a gas box comprising a body comprising:
   a gas box central opening forming a portion of the third gas path and fluidly coupled to the gas manifold central opening;
   a first gas box gas opening disposed about and fluidly separate from the gas box central opening forming a portion of the first gas path and fluidly coupled to the first gas channel;
   a second gas box gas opening disposed about and fluidly separate from the first gas box gas opening forming a portion of the second gas path and fluidly coupled to the second gas channel;
   a first gas box channel fluidly coupled to the first gas box gas opening forming a portion of the first gas path, the first gas channel comprising a first fluid conduit surrounded by the body of the gas box and extending along a first radial path extending from the center of the gas box;
   a second gas box channel fluidly coupled to the second gas box gas opening forming a portion of the second gas path, the second gas channel comprising a second fluid conduit surrounded by the body of the gas box and extending along a second radial path extending from the center of the gas box;
   a third gas box channel fluidly coupled to the gas box central opening forming a portion of the third gas path, the third gas channel comprising a third fluid conduit surrounded by the body of the gas box and extending along a third radial path extending from the center of the gas box, wherein the first radial path, second radial path and third radial path are different radial paths within the body of the gas box; and
a showerhead fluidly coupled to the gas manifold, the showerhead comprising:
   one or more first gas openings forming a portion of the first gas path, that are configured to receive the first gas while fluidly isolating the first gas from the second gas, and
   one or more second gas openings forming a portion of the second gas path, that are configured to receive the second gas while fluidly isolation the second gas from both the first gas and the third gas,
a first plate coupled to an upper surface of the showerhead, the first plate comprising:
a first plate first plenum fluidly coupled, through the first fluid conduit of the gas box to the first gas channel of the manifold and through the third conduit of the gas box to the third gas channel of the manifold,
the fluid coupling of the first plate first plenum through the first fluid conduit to the first gas channel of the manifold and the fluid coupling of the third conduit of the gas box to the third gas channel of the manifold together defining a fourth gas path combining at least portions of the first and third gas paths;
a first plate second gas opening fluidly coupled, through the second conduit of the gas box, to the second gas channel of the manifold and fluidly isolated from the first plate plenum, further defining the second gas path;
   wherein a plurality of the first gas openings are surrounded by a plurality of second gas openings and a plurality of the second gas openings are surrounded by a plurality of first gas openings.

2. The lid assembly of claim 1, wherein the one or more first gas openings of the showerhead and the one or more second gas openings of the showerhead are also fluidly coupled to the third gas channel of the gas manifold.

3. The lid assembly of claim 1, further comprising:
a second plate coupled to the upper surface of the showerhead and in contact with the gas box, the second plate comprising:
   a second plate plenum fluidly coupled to the first plate plenum, further defining the fourth gas path;
   a second plate third gas opening fluidly coupled to the first plate second gas opening separately from the second plate plenum, further defining the second gas path.

4. The lid assembly of claim 3, wherein the gas manifold comprises a plurality of the first gas channels, wherein the plurality of first gas channels are arranged in a radially-extended spoked configuration each extending along a different radial path extending from the center of the gas manifold.

5. A lid assembly comprising:
a gas distribution assembly configured to deliver a processing gas to a processing region, comprising:
   a gas box comprising a body, comprising:
   a gas box central opening fluidly coupled to gas manifold central opening;
   a first gas box gas opening disposed about and fluidly separate from the gas box central opening;
   a second gas box gas opening disposed about and fluidly separate from the first gas box gas opening;
   a first gas channel fluidly coupled to the first gas box gas opening, the first gas channel comprising a first fluid conduit surrounded by the body of the gas box and extending along a first radial path extending from the center of the gas box;
   a second gas channel fluidly coupled to the second gas box gas opening the second gas channel comprising a second fluid conduit surrounded by the body of the gas box and extending along a second radial path extending from the center of the gas box;
   a third gas channel fluidly coupled to the gas box central opening the third gas channel comprising a third fluid conduit surrounded by the body of the gas box and extending along a third radial path extending from the center of the gas box, wherein the first radial path, second radial path and third radial path are different radial paths within the body of the gas box; and
   a showerhead fluidly coupled to the gas box, the showerhead comprising:
   a first plate, a second plate and a third plate, a first plenum interposed between the gas box and the first plate, and a second plenum interposed between the first plate and the second plate;
   one or more first plate first gas openings in the first plate fluidly coupled to the first gas channel through the first plate and configured to receive a first gas therefrom while fluidly isolating the first gas from a second gas; and one or more first plate second gas openings fluidly coupled to the second gas channel to receive the second gas while fluidly isolating the second gas from both the first gas and a third gas;

a plurality of first third plate openings formed in a central location of a first surface of the third plate and opening into the processing region, the plurality of first third plate openings fluidly connected to the first fluid conduit and the third fluid conduit;

a plurality of second third plate openings formed in the first surface of the first plate and opening into the processing region and located therein radially outwardly of the plurality of first third plate openings, the plurality of second third plate openings fluidly isolated from the plurality of first third plate openings within the third plate and fluidly connected to the second fluid conduit; and the second plate disposed between the third plate and the first plate and having a plurality of first second plate gas passages and second second plate gas passages;

the plurality of first second plate gas passages of the second plate fluidly coupled to the plurality of first third plate openings formed in the third plate; and the plurality of second second plate gas passages of the second plate fluidly coupled to a plurality of first plate second gas openings, wherein the plurality of second plate second gas passages of the second plate are fluidly isolated from the plurality of first third plate openings of the third plate.

6. The lid assembly of claim 5, wherein the first plate first gas openings are in fluid communication between the first plenum and the second plenum.

7. The lid assembly of claim 6, wherein:

the first gas channel of the gas box is fluidly coupled to the first plenum;

the second gas channel of the gas box is fluidly coupled to the second gas openings of the first plate; and the gas box central opening is fluidly isolated from the first gas channel of the gas box and the second gas channel of the gas box within the gas box.

8. The lid assembly of claim 7 wherein the first gas channel of the gas box is disposed radially outwardly of the gas box central opening, and the gas box second gas channel is disposed radially outwardly of the gas box first gas channel.

9. The lid assembly of claim 7, wherein the gas box includes a central opening formed therein.

10. The lid assembly of claim 9, wherein a ceramic shield is disposed in contact with the central opening of the gas box.

11. The lid assembly of claim 10, wherein a ceramic shield comprises aluminum nitride, and includes one or more openings formed in a sidewall thereof.

* * * * *